(12) United States Patent
Xu et al.

(10) Patent No.: US 7,705,594 B2
(45) Date of Patent: Apr. 27, 2010

(54) SYSTEM AND METHOD FOR DESIGNING IMPROVED RF PULSE PROFILES

(75) Inventors: Dan Xu, Springfield, IL (US); Kevin F. King, Menomonee Falls, WI (US); Zhi-Pei Liang, Champaign, IL (US)

(73) Assignees: General Electric Company, Schenectady, NY (US); University of Illinois at Urbana Champaign, Urbana, IL (US)

( * ) Notice: Subject to any disclaimer, the term of this patent is extended or adjusted under 35 U.S.C. 154(b) by 164 days.

(21) Appl. No.: 11/694,617

(22) Filed: Mar. 30, 2007

(65) Prior Publication Data

US 2008/0238425 A1 Oct. 2, 2008

(51) Int. Cl.
*G01V 3/00* (2006.01)

(52) U.S. Cl. .................................................... 324/307

(58) Field of Classification Search ......... 324/300–322; 600/410–435
See application file for complete search history.

(56) References Cited

U.S. PATENT DOCUMENTS

| | | | | |
|---|---|---|---|---|
| 4,812,760 A | * | 3/1989 | Bottomley et al. | 324/309 |
| 5,201,311 A | * | 4/1993 | Bottomley et al. | 600/422 |
| 5,821,752 A | * | 10/1998 | LeRoux | 324/314 |
| 6,728,569 B2 | * | 4/2004 | Edelman | 600/410 |
| 7,199,585 B2 | * | 4/2007 | Kruiskamp et al. | 324/320 |
| 2007/0236216 A1 | * | 10/2007 | Pipe | 324/307 |
| 2008/0284439 A1 | * | 11/2008 | Xu et al. | 324/322 |

OTHER PUBLICATIONS

U. Katscher, P. Börnert, C. Leussler, and J. S. Van Den Brink, "Transmit SENSE", Magnetic Resonance in Medicine, vol. 49, pp. 144-150, 2003.

Y. Zhu, "Parallel Excitation With an Array of Transmit Coils", Magnetic Resonance in Medicine, vol. 51, pp. 775-784, 2004.

J. L. Ulloa, M. Callaghan, M. Guarini, J. V. Hajnal, and P. Irarrazaval, "Calculation of B1 pulses for RF shimming at arbitrary flip angle using multiple transmitters", in Proc. 14th Ann. Meet. Intl. Soc. Mag. Reson. Med., p. 3016, Seattle, Washington, May 2006.

S. Conolly, D. Nishimura, and A. Macovski, "Optimal Control Solutions to the Magnetic Resonance Selective Excitation Problem", IEEE Transactions on Medical Imaging, vol. MI-5, pp. 106-115, Jun. 1986.

S. Conolly, D. Nishimura, and A. Macovski, "Selective Complex Pulse Design By Optimal Control Theory", in Proc. 5th Ann. Meet. Soc. Mag. Reson. Med., p. 1456-1457, Montreal, Canada, Aug. 1986.

(Continued)

*Primary Examiner*—Brij B Shrivastav
*Assistant Examiner*—Dixomara Vargas
(74) *Attorney, Agent, or Firm*—Ziolkowski Patent Solutions Group, SC (57) ABSTRACT

A system and method are provided for designing RF pulses which have improved magnetization profiles. By utilizing an optimal control approach as an alternative to, or in combination with, non-iterative approximations, RF pulses generated by the system and method described herein will exhibit less deviation from that of "ideal" Bloch solutions. Consequently, the magnetization profiles produced by the RF pulses generated by the system and method described herein will be closer to the desired profiles. In addition, limitations of non-iterative approximations, such as maximum tip angle limits and linearity constraints, can be avoided.

27 Claims, 5 Drawing Sheets

OTHER PUBLICATIONS

D. Rosenfeld and Y. Zur, "Design of Adiabatic Selective Pulses Using Optimal Control Theory", Magn. Reson. Med., vol. 36, pp. 401-409, 1996.

T. E. Skinner, T. O. Reiss, B. Luy, N. Khaneja, and S. J. Glaser, "Application of optimal control theory to the design of broadband excitation pulses for high-resolution NMR", Journal of Magnetic Resonance, vol. 163, pp. 8-15, 2003.

C. K. Anand, S. J. Stoyan, and T. Terlaky, "Optimizing the gVERSE RF Pulse Design via Optimal Control", Technical report, Advanced Optimization Laboratory, McMaster University, Canada, 2005.

C.-Y. Yip, J. A. Fessler, and D. C. Noll, "Iterative RF Pulse Design for Multidimensional, Small-Tip-Angle Selective Excitation", Magnetic Resonance in Medicine, vol. 54, pp. 908-917, 2005.

A. E. Bryson, Jr. and Y.-C. Ho, Applied Optimal Control, Hemisphere Publishing Corporation, Washington, DC, pp. 47-49 and 221-225, 1975.

* cited by examiner

SYSTEM AND METHOD FOR DESIGNING IMPROVED RF PULSE PROFILES

BACKGROUND OF THE INVENTION

The present invention relates generally to magnetic resonance imaging, and more specifically, to a system and method for designing multi-dimensional spatially-selective RF pulse profiles using an optimal control approach. By defining an RF pulse profile using optimal control, the resulting magnetization therefrom can be rendered more accurately, especially for larger tip angles. Embodiments of the present invention find particular utility in parallel transmission applications such as localized magnetization manipulations, and in B1 inhomogeneity correction at high main magnetic field strengths. However, one skilled in the art will appreciate that improved RF pulse profiles will benefit any MR imaging process.

MR imaging in general is based upon the principle of nuclear magnetic resonance. When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field, such as a $B_1$ excitation field, which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

For systems using multiple coils or multi-channel RF pulses, as well as for sequences which utilize multidimensional spatially-selective RF pulses, it is beneficial for the RF pulses transmitted by the coils to produce accurate changes in magnetization. In conventional single channel transmission, multidimensional pulses to achieve multidimensional spatial selectivity can have much longer durations than the single dimensional slice-selective pulses. The performance of the single channel transmission pulses can also be rather limited. Thus, parallel transmission of independently-controlled multidimensional RF waveforms has been used to shorten the transmission times and improve the performance of spatial selectivity. However, to date, parallel transmission has only been used for certain types of RF pulses, since most design methods for parallel transmission pulses are based upon mere approximations of the Bloch equations, and therefore are accurate only when certain limitations are met.

One common RF pulse design approach is known as the small tip angle (STA) approximation, which is generally accurate for RF pulse profiles having tip angles of less than 90 degrees. Another approach is known as the linear class large tip angle approximation (LCLTA). These approaches are limited in that they are mere linear approximation of the Bloch equations, and thus have inherent errors in their results. These errors can be translated into ripples and rounded edges in the magnetization profiles when the assumptions of STA/LCLTA are approximately met, or into large distortions from the ideal magnetization profiles when the assumptions are violated. As such, it has been thought that these types of pulses should be derived directly from the Bloch equations.

However, direct derivation of RF pulse shapes from the Bloch equations has so far been limited in practice to single dimensional, single channel (i.e. non-parallel) RF pulses. Some of the more common approaches to directly solving the Bloch equations for 1D single channel pulses are the well-known Shinnar-LeRoux method, the utilization of neural networks, evolutionary methods, simulated annealing, perturbation response methods, iterative correction for hardware nonlinearity, optimal control, inverse scattering transforms, and others. Unfortunately, none of these methods have so far been generalized to accommodate RF pulse design for multi-channel pulse waveforms and/or multi-dimensional spatially-selective pulse waveforms.

It would therefore be desirable to have a system and method capable of producing accurate multidimensional and/or multichannel RF pulse waveforms. It would be further desirable to have embodiments of such a system and method which could account for arbitrary desired flip angles and arbitrary initial magnetization.

BRIEF DESCRIPTION OF THE INVENTION

Embodiments of the present invention provides for the design and implementation of improved RF pulse profiles. According to various embodiments of the invention, RF pulse waveforms can be generated which exhibit a magnetization profile having improved accuracy, improving overall image quality. In addition, such RF pulses may be designed as multichannel and/or multidimensional pulses Therefore, in accordance with one aspect of the invention, an MR imaging apparatus includes a plurality of gradient coils positioned about a bore of a magnet, an RF transceiver system and switch controlled by a pulse module to transmit RF signals to an RF coil array to acquire MR images, and a computer operatively connected to the pulse module. The computer is programmed to define at least one multi-dimensional spatially-selective RF pulse profile to apply to the RF coil array and determine a set of desired magnetization values. The computer is further programmed to then iteratively adjust the RF pulse profile according to the set of desired magnetization values using an optimal control approach. The computer will then cause the pulse module to generate RF pulses for transmission by the RF coil array in accordance with the at least one spatially-selective RF pulse profile, to acquire MR image data, and at least temporarily store the MR image data in memory.

In accordance with another aspect of the invention, a method for MR imaging includes determining a number of parameters which describe a target multi-dimensional spatially-limited B1 field that will cause a desired change in magnetization in nuclei of a scan subject. The method also includes approximating a multi-channel RF waveform to achieve the target multi-dimensional spatially-limited B1 field. A function is then expressed which describes the error between the magnetization of the approximated multi-channel RF waveform and the target magnetization. The method includes minimizing this error function by iteratively adjusting the approximated multi-channel RF waveform, and then causing a number of RF coils to transmit the adjusted approximated multi-channel RF waveform to acquire an MR image data of the scan subject.

In accordance with a further aspect of the invention, an MR system control is provided. The system control includes a computer programmed to receive a request for a multi-channel RF pulse of an arbitrary flip angle and determine an RF pulse shape in accordance with the request using an optimal control algorithm. The system control further includes a pulse module and an RF transceiver. The pulse module is configured to receive the computed RF pulse shape from the computer and generate a corresponding RF waveform. The RF transceiver is connected to output the RF waveform of the pulse module for transmission by an RF coil assembly and to receive resulting MR data therefrom.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Figure 1:
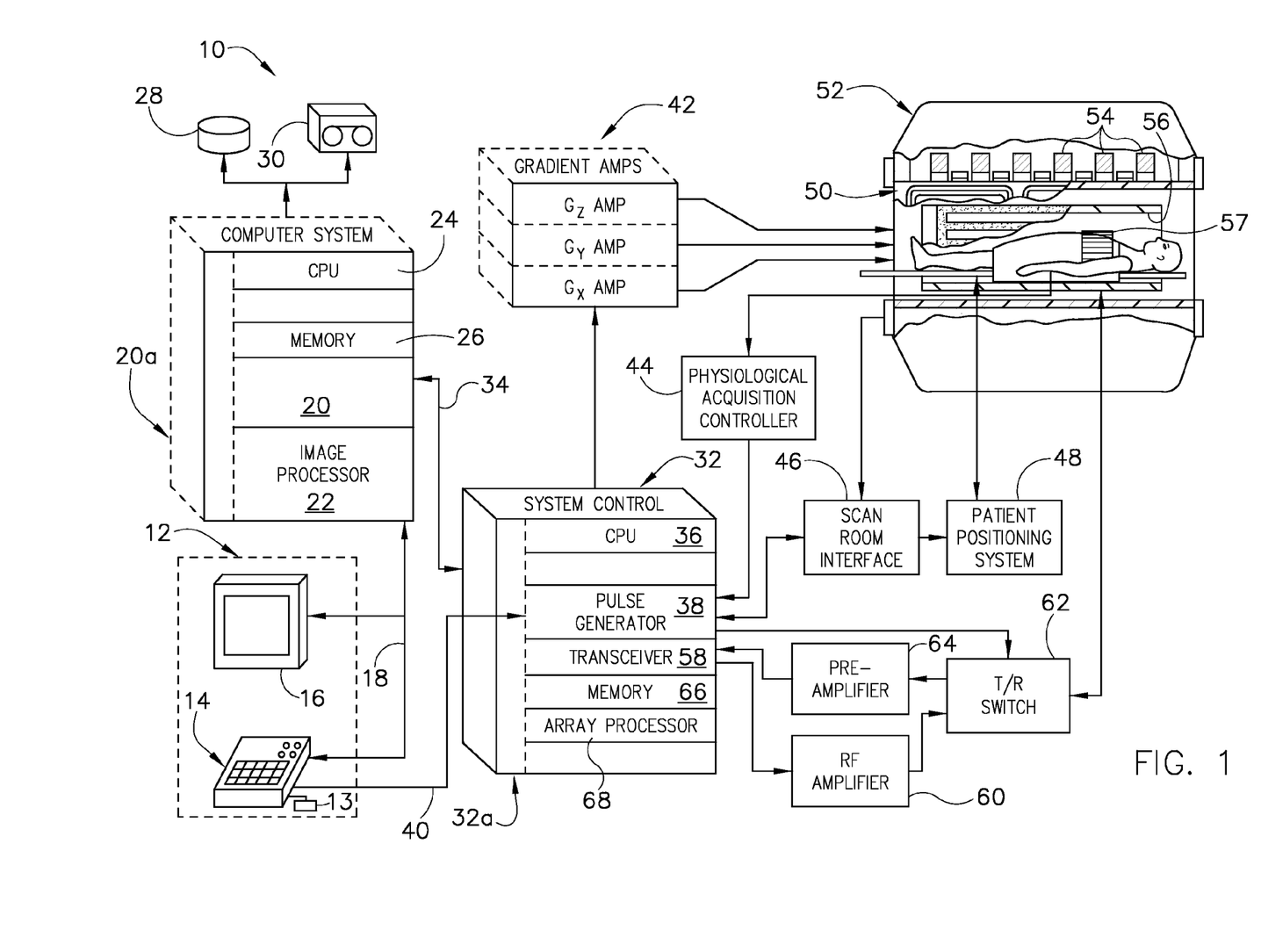
FIG. 1 is a schematic block diagram of an MR imaging system for use with embodiments of the present invention.

Referring to FIG. 1, the major components of a magnetic resonance imaging (MRI) system 10 that may incorporate embodiments of the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56, and may include a surface or parallel RF coil assembly 57. A transceiver module 58 in the system control 32 produces pulses which are amplified by an RF amplifier 60 and coupled to the RF coil 56 or the coil assembly 57 by a transmit/receive switch 62. The resulting signals emitted by the excited nuclei in the patient may be sensed by the same RF coil 56 or coil assembly 57 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 or the coil assembly 57 during the transmit mode and to connect the preamplifier 64 to the coil 56 or the coil assembly 57 during the receive mode.

The MR signals picked up by the RF coil 56 or the coil assembly 57 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the removable storage 30, or it may be further processed by the image processor 22 and conveyed to the operator console 12 and presented on the display 16.

During a transmit sequence, the pulse generator 38 of the system control 32 instructs the transceiver 58, via transmit/receive switch 62, to cause the RF coil 56 or coil assembly 57 to transmit RF pulses of given frequencies having particular profiles. For example, in a spin-echo based sequence, transceiver 58 will cause the RF coils 56 or 57 to transmit an excitation pulse at a particular frequency and transmit power for a particular time, in order to induce a net transverse magnetization in nuclei of a scan subject. Subsequent pulses transmitted by the RF coils 56 or 57 may have the same or a similar frequency, but will have different gain, amplitude, and duration attributes to cause a different change in magnetization in order to cause spin echoes. In general, the particular shapes of the RF pulses in a transmit sequence are varied to manipulate the net magnetization in nuclei of scan subject.

The attributes of RF pulses can be adjusted such that only spins within a given 2D or 3D portion of a scan subject are affected.

The Bloch equations describe the effect of an RF pulse on the magnetization of nuclei in a scan subject, in the presence of a given magnetic field. For a spatially-selective, single-channel, complex RF pulse $B_1(t)=B_{1,x}(t)+iB_{1,y}(t)$ and coincident gradient field $G(t)=[G_x(t), G_y(t), G_z(t)]^T$, without considering $T_1$ and $T_2$ relaxation terms, the Bloch equations can conveniently be expressed in matrix form as:

$$\begin{bmatrix} \dot{M}_x(r,t) \\ \dot{M}_y(r,t) \\ \dot{M}_z(r,t) \end{bmatrix} = \gamma \begin{bmatrix} 0 & G(t)\cdot r & -B_{1,y}(t) \\ -G(t)\cdot r & 0 & B_{1,x}(t) \\ B_{1,y}(t) & -B_{1,x}(t) & 0 \end{bmatrix} \begin{bmatrix} M_x(r,t) \\ M_y(r,t) \\ M_z(r,t) \end{bmatrix} \quad \text{Eqn. 1}$$

where r represents a spatial location vector $[x, y, z]^T$ (which can be 1D, 2D, or 3D), $\gamma$ is the gyromagnetic ratio of the nuclei to be excited, and $\dot{M}(r, t)$ is short for the change in magnetization per unit time, $\partial M(r,t)/\partial t$, for the x, y, and z directions. The Bloch equations as expressed in Eqn. 1, describe the composite RF field resulting from all coils used in transmission. When multiple surface coils, parallel coil arrays, and other multi-channel coil assemblies are to be used, it is useful to describe the net x, y, and z effects on magnetization as the aggregate effects of RF pulses transmitted by multiple coils.

When an array of coils is used to transmit RF pulses, the net magnetization at any given position is a function of both time and space (i.e. distance from each coil), since each coil will have its own space-dependent $B_1$ field. Therefore, the net $B_1$ field resulting from transmissions by a number L of RF coils can be expressed as:

$$B_1(r,t) = \sum_{l=1}^{L} s_l(r) b_1^{(l)}(t) \quad \text{Eqn. 2}$$

where $s_l(r)$ is the transmit sensitivity of the lth coil and $b_1^{(l)}(t)$ is the RF waveform transmitted by the lth coil. Decomposing $B_1(r, t)$ into its x and y components, each having real (R) and imaginary (I) parts gives, for each coil l=1 to L:

$$b_1^{(l)}(t)=u_l(t)+iv_l(t) \quad \text{Eqn. 3}$$

and $$s_l(r)=s_l^{(R)}(r)+is_l^{(I)}(r) \quad \text{Eqn. 4}$$

Therefore, Eqn. 1 can be re-written as:

$$\dot{M}(r,t) = \left[ A(r,t) + \sum_{l=1}^{L} B^{(l)}(r) u_l(t) + \sum_{l=1}^{L} C^{(l)}(r) v_l(t) \right] M(r,t) \quad \text{Eqn. 5}$$

where:

$$A(r,t) = \gamma \begin{bmatrix} 0 & G(t)\cdot r & 0 \\ -G(t)\cdot r & 0 & 0 \\ 0 & 0 & 0 \end{bmatrix} \quad \text{Eqn. 6}$$

$$B^{(l)}(r) = \gamma \begin{bmatrix} 0 & 0 & -s_l^{(I)}(r) \\ 0 & 0 & s_l^{(R)}(r) \\ s_l^{(I)}(r) & -s_l^{(R)}(r) & 0 \end{bmatrix} \quad \text{Eqn. 7}$$

and $$C^{(l)}(r) = \gamma \begin{bmatrix} 0 & 0 & -s_l^{(R)}(r) \\ 0 & 0 & -s_l^{(I)}(r) \\ s_l^{(R)}(r) & s_l^{(I)}(r) & 0 \end{bmatrix} \quad \text{Eqn. 8}$$

Therefore, one skilled in the art will appreciate that a desired change in magnetization $\dot{M}(r, t)$ can be expressed as a function of the RF pulse waveforms of a multi-channel coil array. With respect to Eqn. 5, for a desired magnetization profile, $A(r, t)$, $B^{(l)}(r)$, and $C^{(l)}(r)$ will be given; the goal is therefore to find $u_l(t)$ and $v_l(t)$ (vectors of the real and imaginary components of the multi-channel RF pulse profile/waveform to be designed) to produce $M(r,t)$ such that $M(r,T)$ is close to a desired magnetization profile (T is the pulse duration).

Embodiments of the present invention use concepts from optimal control theory to quickly and accurately solve for a $u_l(t)$ and $v_l(t)$ to design RF pulse profiles which will effectuate a desired magnetization profile, including profiles for multi-channel and/or multi-dimensional spatially-selective pulses having arbitrarily high or low flip angles which can be accurately used in spin systems experiencing an arbitrary initial magnetization. Thus, Eqn. 5 can be formulated as an error minimization problem, having $u_l(t)$ and $v_l(t)$ as the control variables. It is understood however, that other variables may also be used as controls in an error minimization problem, as an alternative to, or in combination with the $u_l(t)$ and $v_l(t)$ controls. For example, instead of choosing a fixed $G(t)$, we can choose it as an independent control. Also, the pulse duration T can be a solvable variable in the error minimization problem.

One way to express Eqn. 5 as an error minimization problem is to develop a cost function J where the error $\phi$ between a known, target magnetization vector, D, and the magnetization caused by the $u_l(t)$ and $v_l(t)$ is weighted. Therefore, a degree of preference can be expressed for error in any given spatial location or for a particular coil, etc. One way to express such a preference in this error term is:

$$\varphi = \frac{1}{2}[M(T) - D]^T W [M(T) - D] \quad \text{Eqn. 9}$$

Thus, Eqn. 9 is a weighted norm of the error between the effective magnetization, $M(T)$, of the $u_l(t)$ and $v_l(t)$ controls and the target magnetization, D, multiplied by a weighting vector W. Weighting vector W can be a diagonal matrix of weights which are set to effect a spatial error preference. Although weighted mean squared error is used here, it is appreciated that other error terms, such as the $L_\infty$-norm of $M(T)-D$, may also be used.

Further, several approaches can be used for ensuring that the RF pulse profile produced as a result of the minimization problem conforms to hardware and SAR constraints. First, a set of hard constraints can be imposed upon a minimizing cost function J. For example, any proposed set of values of $u_l(t)$ and $v_l(t)$ which would exceed the maximum transmit power of the scanner hardware could be ignored. When the minimization of the cost function J exceeds a hard constraint, the minimizing would back-track or restart altogether. Alternatively, an unconstrained penalty approach can be used. Rather than apply hard constraints, a penalty function can be added to the error term of Eqn. 9 which stiffly increases the error when a constraint is reached. For example, if a proposed set of $u_l(t)$ and $v_l(t)$ values would exceed the maximum transmit power of the scanner hardware, a penalty will be added to the error term. In this manner, the minimizing need not backtrack or restart, but will still avoid penalty terms (i.e. "constraints"). One way to express such a penalty function is:

$$\min_{\{u_l(t), v_l(t)\}_{l=1}^L} J[u_1, \ldots, u_L, v_1, \ldots, v_L] = \qquad \text{Eqn. 10}$$

$$\frac{1}{2}[M(T)-D]^T W[M(T)-D] + \frac{1}{2}\alpha\left[\sum_{l=1}^L u_l^2(t) + \sum_{l=1}^L v_l^2(t)\right]$$

where $$\frac{1}{2}\alpha\left[\sum_{l=1}^L u_l^2(t) + \sum_{l=1}^L v_l^2(t)\right]$$

is a function which produces a penalty term proportional to the transmit power with relative weighting α. Other penalties and constraints may include a peak $B_1$ value and a degree of RF waveform jaggedness. When G(t) is chosen as a control, the penalties and constraints may also include a maximum gradient amplitude and a maximum slew rate.

To incorporate the constraints in Eqn. 5 and express Eqn. 10 in a simpler manner for unconstrained minimization, Lagrange multipliers and the calculus of variations are used such that:

$$\dot{\lambda}(t) = \left[A(t) + \sum_{l=1}^L B^{(l)} u_l(t) + \sum_{l=1}^L C^{(l)} v_l(t)\right]\lambda(t) \qquad \text{Eqn. 11}$$

$$\lambda(t)^T B^{(l)} M(t) + \alpha u_l(t) = 0, \qquad \text{Eqn. 12}$$

and $$\lambda(t)^T C^{(l)} M(t) + \alpha v_l(t) = 0, \qquad \text{Eqn. 13}$$

where λ(t) is the Lagrange multiplier and λ(T) represents the final state of the system with M(0) representing the initial state of the system. Thus, the boundary conditions for minimization of the cost function J are:

$$\lambda(T) = \frac{\partial \varphi(M(T))}{\partial M(T)} \qquad \text{Eqn. 14}$$

and $$M(0) = M_0 \qquad \text{Eqn. 15}$$

where M(0) represents the initial state or initial magnetization in x, y, and z present at every spatial location in the nuclei to be imaged. When combined with a general weighting function W of Eqn. 10, $$\lambda(T) = W(M(T) - D) \qquad \text{Eqn. 16}$$

Therefore, in minimizing the cost function J, M(t) and λ(t) are the state variables and $u_l(t)$ and $v_l(t)$ are the controls to be designed. Since the boundary conditions are given at t=0 for M(t) and t=T for λ(t), minimizing the cost function J is a two-point boundary-value problem.

Once the cost function J is determined, any constraints or penalties are set, and the minimization is expressed as a two-point boundary-value problem, the actual minimizing can proceed in accordance with a number of different optimization algorithms. That is, according to optimal control theory, multi-control error functions such as described above can be minimized according to first order gradient optimization algorithms, second order gradient optimization algorithms, and conjugate-gradient algorithms. Since, theoretically, such an optimization algorithm might approach merely a local minimum of the minimization problem, rather than an absolute minimum, it may be desirable in some instances to initialize the RF waveform to be designed according to a known approximation method.

In other words, the RF waveform of the controls $u_l(t)$ and $v_l(t)$, as described in Eqn. 2, can be initialized by using a common pulse design approach. For example, the small tip angle (STA) approximation could be used to find values for $u_l(t)$ and $v_l(t)$, so that the minimization problem starts at a point in the hypothesis space nearer to the absolute minimum, thereby reducing the chance of stall at a local minimum and significantly decreasing computational time. As known in the art, the appropriate type of pulse design approximation will be determined by the type of pulse to be designed.

The minimization algorithms generally start with setting a number or parameters, such as an error tolerance ε, a maximum adjustment or "step" size μ, a maximum number of iterations K, and determining the initial magnetization vectors for all $0 \leq t \leq T$. Several techniques, such as the Armijo rule and the heuristic approach, can be used to choose μ. Likewise, the number of iterations and the error tolerance can be chosen in a number of ways, influenced by the trade-off between precision and computational time and complexity. Once the initial parameters are set, the algorithm will compare the error term of Eqn. 10 to the error tolerance ε for k=0 to k=K. If the error term is outside the error tolerance, the algorithm will determine λ(t) for all t according to Eqn. 11 and update the controls as:

$$u_l^{(k+1)}(t) = u_l^{(k)}(t) - \mu[\lambda^{(k)T}(t) B^{(l)} M^{(k)}(t) + \alpha u_l^{(k)}(t)] \qquad \text{Eqn. 17}$$

and $$v_l^{(k+1)}(t) = v_l^{(k)}(t) - \mu[\lambda^{(k)T}(t) C^{(l)} M^{(k)}(t) + \alpha v_l^{(k)}(t)] \qquad \text{Eqn. 18}$$

If the updated controls produce an increased cost in cost function J of Eqn. 10, μ is considered too large and the algorithm is likely not converging. In such a case, μ may be decreased or otherwise changed (e.g. halved) and Eqs. 17 and 18 can be evaluated again. This repeats until a decreased cost is found, or the maximum number of trials (also predefined) is reached. Thereafter, the iteration value k is incremented and M(t) is re-evaluated for all t according to Eqn. 5.

The evaluation of M(t) or λ(t) for all t can be performed either by numerically solving the differential equations or by discretizing t, making hard pulse approximations, and solving for M(t) or λ(t) using rotation operations in spinor forms. The discretization-based solution is often more computationally efficient. Additionally, pulse waveforms which are discretized along t and which rely on hard pulse approximations have been shown to hold in reality. For M(t), the rotation operations are forward (i.e. rotate a positive angle starting from t=0 to t=T), while for λ(t), the rotation operations are backward (i.e. rotate a negative angle starting from t=T backward to t=0).

Figure 2:
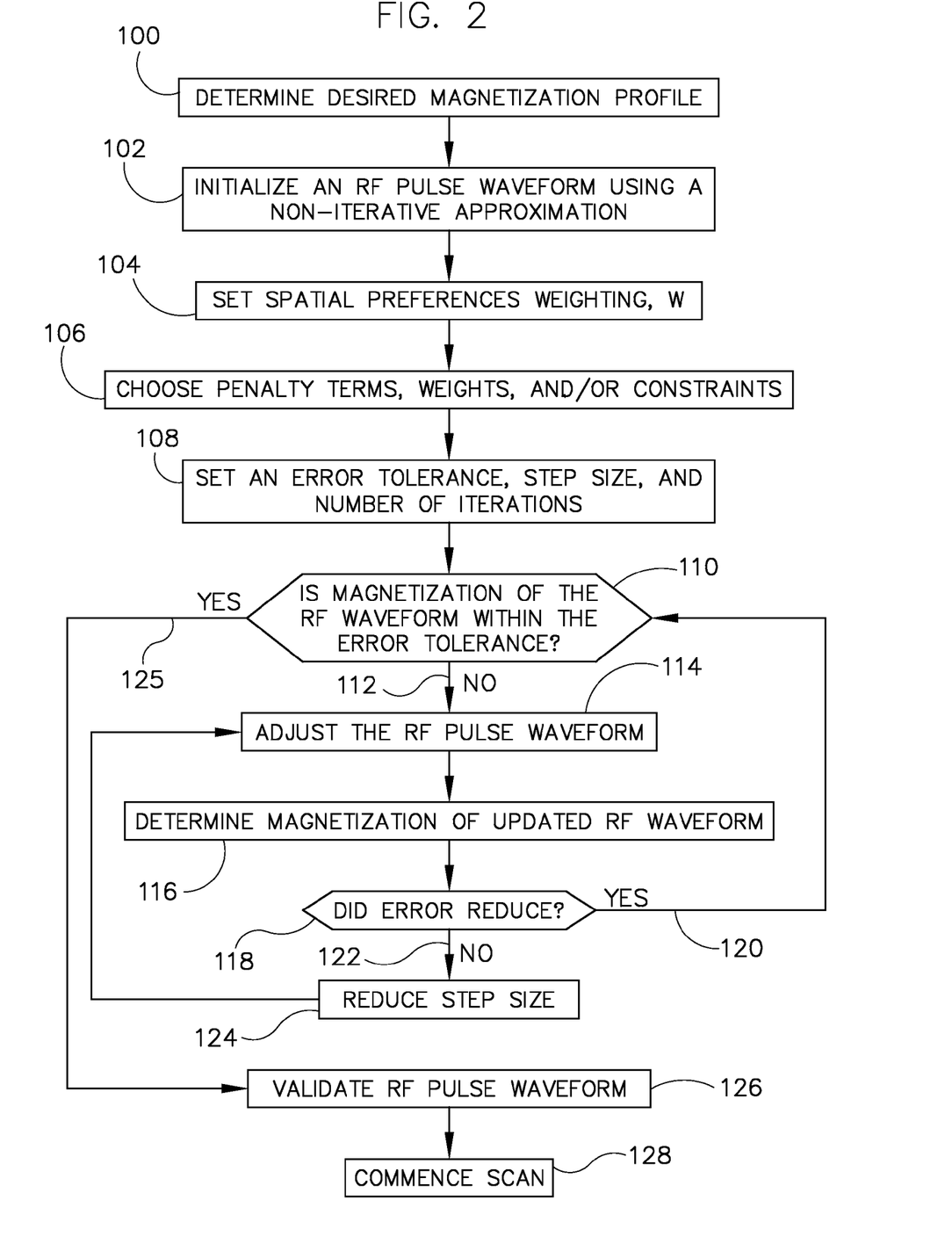
FIG. 2 is a flowchart representing an exemplary technique for designing an RF pulse profile in accordance with an embodiment of the present invention.

FIG. 2 is a flowchart illustrating the steps of a practical implementation of the above-discussed techniques. First, at block 100, an operator of an MR system will enter a desired/target magnetization profile into a user interface of the system (such as at console 12 of FIG. 1). The user may simply enter values describing the x, y, and z magnetization directly, or the target magnetization can be derived by the system from a number of other parameters such as pulse type, flip angle, pulse duration, k-space trajectory, or the composite B1 field that is desired, etc. Next, at block 102, the system may approximate an RF waveform according to the desired magnetization profile using a known non-iterative approach such as STA or LCLTA. This RF waveform will be used as an input to an optimization algorithm as discussed above. In some embodiments, the user may have the approximation performed separately and provide the result to the MR system. In other embodiments, the system may prompt the user to enter sufficient data at block 100 such that the MR system itself can automatically perform the approximation at block 102. Alternatively, the system may begin with a default, arbitrary RF waveform as an input to the optimization, instead of initializing with an approximation.

The system will then begin formulation of a minimization problem from an error function, describing the difference in magnetization between the user-defined target magnetization and the RF waveform being designed. In doing so, the system may prompt a user at block 104 to enter a spatial error preference which is used to develop a weighting matrix W, as discussed above with respect to Eqn. 9. The system may also prompt the user to select parameter constraints and/or penalty terms, along the proportional weightings thereof at block 106. For example the system may ask a user to enter or choose a transmit power penalty weight α. Alternatively, the system may simply resort to default values for the penalty terms, or may skip the penalty terms altogether. Similarly, the system can allow a user to select optimization algorithm parameters such as the error tolerance, the number of iterations, and the step size at block 108, or the system can use default values. Once the optimization parameters are set, the system can begin iteratively minimizing the cost function to obtain the RF pulse waveform.

During the iterations of the optimization algorithm, the system will assess the error in the magnetization M(T) of the RF pulse waveform being designed against the target magnetization D, subject to any weighting at block 110. If the error is greater than the tolerance 112, the system will adjust the parameters $u_f(t)$ and $v_f(t)$ describing the RF pulse at block 114. The system will then re-evaluate the magnetization M(T) of the adjusted RF pulse waveform at block 116 and determine whether such adjustment will actually decrease the error in magnetization at block 118. If the adjustment will not decrease the error 122, the system will reduce or otherwise alter the step size μ at block 124 and re-perform the adjustment at block 114. If the adjustment does decrease the error in the magnetization M(T) resulting from the RF pulse 120, then the system returns to block 110 to re-evaluate whether the magnetization M(T) is within the error tolerance of the target magnetization D. If the RF pulse waveform will produce a magnetization that is within the error tolerance, the iterative algorithm will cease 125. Once the RF pulse waveform is satisfactorily designed, a user can validate the RF pulse in simulations at block 126, then commence a scan sequence using the RF pulse to acquire MR data and reconstruct an image having improved quality at block 128.

Figure 3:
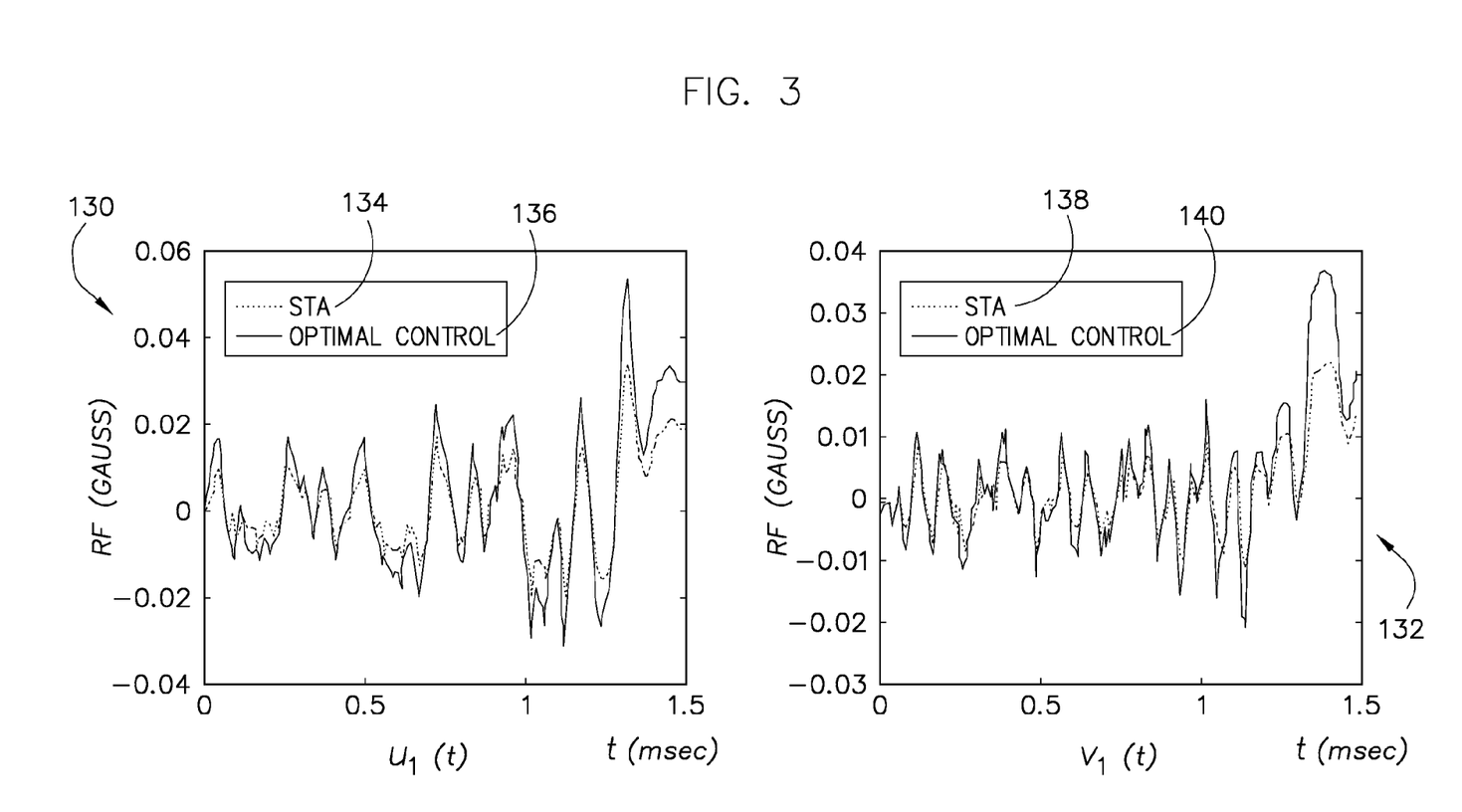
FIG. 3 is a comparison graph of an RF pulse waveform produced in accordance with an embodiment of the invention and an RF pulse waveform produced by an approximation method.

Referring to FIG. 3, graphs 130, 132 of the real $u_f(t)$ and imaginary $v_f(t)$ portions respectively of an approximation waveform 134, 138 and a waveform 136, 140 generated in accordance with an embodiment of the invention are shown. Both waveforms were designed to be one channel of a multi-channel 2D excitation pulse of a 90 degree tip angle, to excite the same area in the same field of view. Graph 130 shows that the real component 134 of a waveform calculated by the STA approximation is significantly different in comparison to the real component 136 of a waveform calculated in accordance with an embodiment of the invention. Similarly, the imaginary component 138 of an STA waveform also is significantly different than the imaginary component 140 of a waveform of an embodiment of the invention. The difference between the waveforms illustrates the error inherent in small tip angle approximations of a 90 degree pulse.

Figure 4:
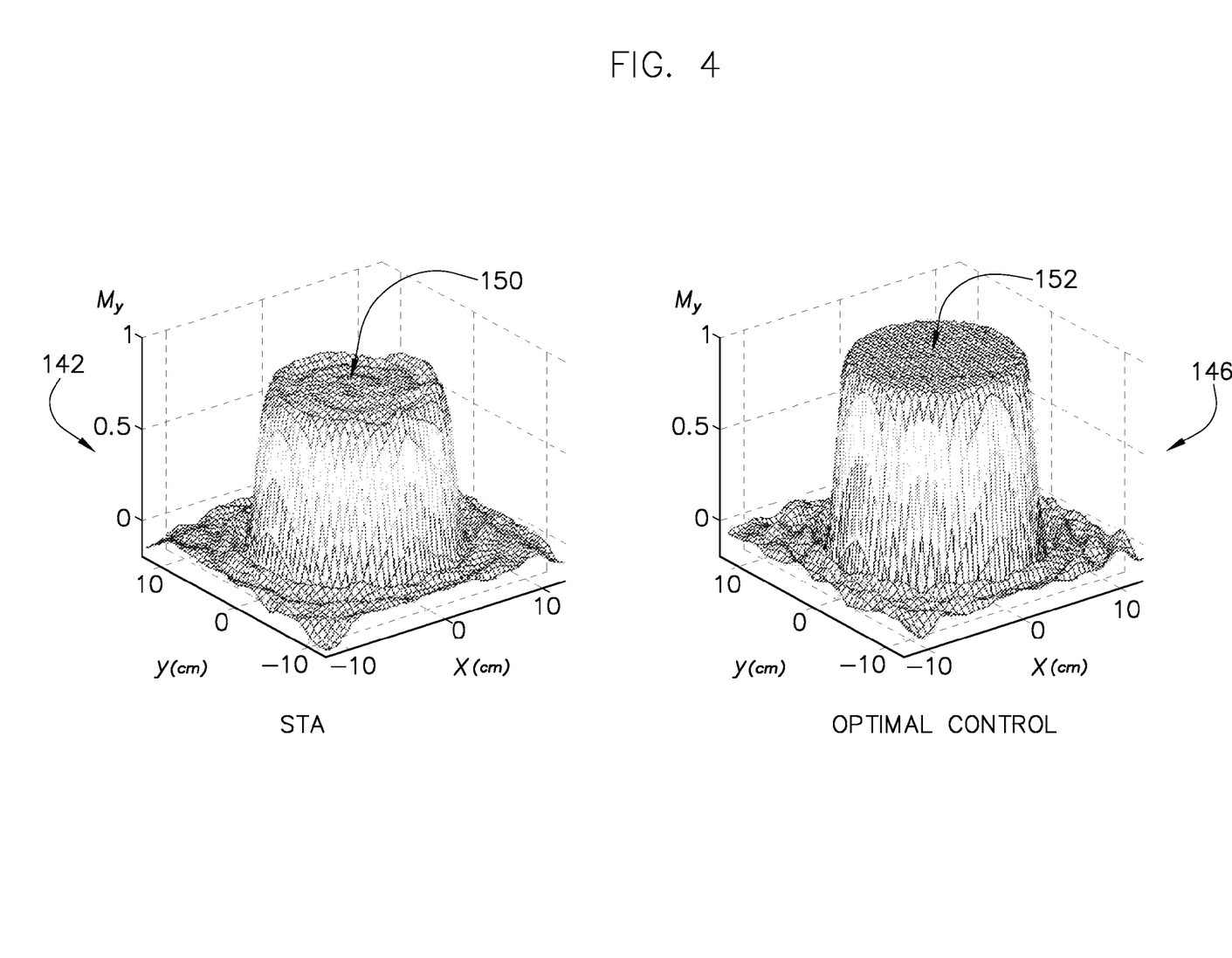
FIG. 4 is a comparison graph of the magnetization caused by the RF pulses of FIG. 3.

As shown in FIG. 4, the error in an approximation pulse can lead to inhomogeneities in the magnetization caused by such a pulse. Graph 142 is a 3D visualization of the spatially-selective transverse magnetization in the x and y directions of an excited slice from an STA-approximated pulse. Graph 146 is a 3D visualization of the spatially-selective transverse magnetization in the x and y directions of the same excited slice from a pulse generated in accordance with an embodiment of the present invention. As can be seen, the STA magnetization 142 exhibits ripples and non-uniformities 150 whereas the magnetization 146 achieved through an embodiment of the invention is comparatively smooth 152.

Figure 5:
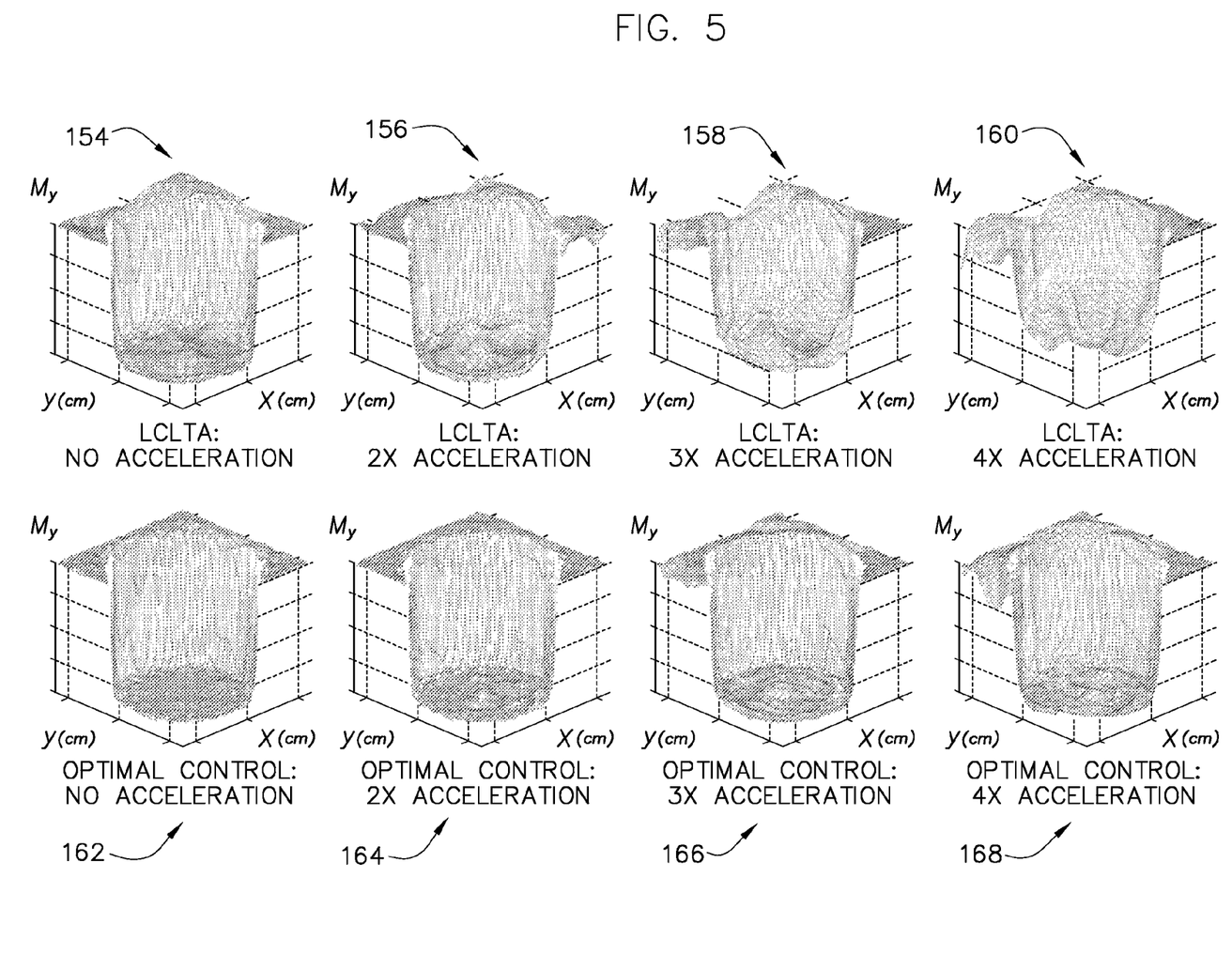
FIG. 5 is a comparison graph of the magnetization caused by RF pulses, with acceleration, produced in accordance with the present invention and RF pulses, with acceleration, produced by an approximation method.

FIG. 5 illustrates another example of the improved accuracy achieved by embodiments of the invention. The magnetization profiles of four 2D refocusing pulses 154-160, designed for spiral acquisition of a k-space using an LCLTA approximation, are shown. Magnetization profiles 156, 158, and 160 were designed using a technique known as "acceleration." As previously discussed, conventionally-designed 2D RF pulses can often have a duration which makes their use inefficient or ineffective, due to phase accumulation from off resonant spins and T2 decay. The duration of these pulses can be decreased when multiple transmit channels are available and through the use of an "acceleration" of the pulses. Acceleration refers to an omitting or undersampling of some portion of the excitation k-space in order to shorten the pulse duration. For example, in a spiral k-space trajectory, an acceleration could be an increase in the distance between spiral turns of the acquisition trajectory. If no compensation is made for the undersampling, the resulting magnetization can be significantly degraded by aliasing caused by the excited field of view being too small. However, with multiple transmit channels, compensation for the acceleration is possible by including information from the spatial profile of the transmit coils in the design of the RF pulse in lieu of the omitted k-space information.

The pulse corresponding to profile 154 in FIG. 5 was designed for spiral acquisition with no acceleration, the pulse of profile 156 was designed for spiral acquisition with 2× acceleration, the pulse of profile 158 was designed for spiral acquisition with 3× acceleration, and the pulse of profile 160 was designed for 4× acceleration. As can be seen, each pulse shows some degree of rippling and general non-uniformities, with the errors increasing proportionally to the acceleration factor. These four pulses 154-160 used as initializing inputs to an RF pulse design embodiment of the present invention, produce pulses whose respective magnetization profiles 162-

168 are also shown. Optimized magnetization profile 162 shows virtually no ripple or non-uniformity, and generally has a smoother and more accurate shape than profile 154. Though the degree of error in the optimized profiles 164, 166, 168 increases proportionally to acceleration factor, each optimized profile shows a significant improvement in shape compared to the corresponding LCLTA profiles 156-160.

Therefore, it has been shown that embodiments of the invention can generate RF pulse waveforms having improved magnetization profiles. In addition, embodiments of the invention not only improve the shape of magnetization profiles compared to approximation methods, but also are not limited by the tip angle size, initial magnetization, or linearity constraints of the approximation methods. In implementation, a real technical effect of embodiments the present invention is the ability to utilize improved RF pulses in MR image acquisitions.

Accordingly, in one embodiment of the present invention, a magnetic resonance imaging apparatus includes a plurality of gradient coils positioned about a bore of a magnet, an RF transceiver system and switch, and a computer. The RF transceiver system and switch are controlled by a pulse module to transmit RF signals to an RF coil array to acquire MR images. The computer is operatively connected to the pulse module and programmed to define at least one multi-dimensional spatially-selective RF pulse profile to apply to the RF coil array and determine a set of desired magnetization values. The computer is further programmed to then iteratively adjust the RF pulse profile according to the desired magnetization values using an optimal control approach. The computer will then cause the pulse module to generate RF pulses for transmission by the RF coil array in accordance with the RF pulse profile, to acquire MR image data, and at least temporarily store the MR image data in memory.

Another embodiment of the present invention provides for a method of MR imaging. The method includes determining a number of parameters which describe a target multi-channel, multi-dimensional spatially-limited B1 field that will cause a desired change in magnetization in nuclei of a scan subject. The method also includes approximating a multi-channel RF waveform to achieve the target multi-dimensional spatially-limited B1 field. An error function is then expressed, describing an error in a magnetization of the approximated multi-channel RF waveform with respect to the desired magnetization change. The method minimizes this error function by iteratively adjusting the approximated multi-channel RF waveform. A number of RF coils are then caused to transmit the adjusted approximated multi-channel RF waveform to acquire an MR image data of the scan subject.

In accordance with another embodiment of the invention, an MR system control has a computer, a pulse module, and an RF transceiver. The computer is programmed to receive a request for a multi-channel RF pulse of some arbitrary flip angle and determine an RF pulse shape in accordance with the request using an optimal control algorithm. The pulse module is configured to receive the computed RF pulse shape from the computer and generate a corresponding RF waveform. The RF waveform is outputted by the RF transceiver for transmission by an RF coil assembly. The RF transceiver then receives MR data resulting from the transmission.

The present invention has been described in terms of the preferred embodiment, and it is recognized that equivalents, alternatives, and modifications, aside from those expressly stated, are possible and within the scope of the appending claims.

What is claimed is:

1. A magnetic resonance (MR) imaging apparatus comprising:
   a plurality of gradient coils positioned about a bore of a magnet;
   an RF transceiver system and switch controlled by a pulse module to transmit RF signals to an RF coil array to acquire MR images; and
   a computer operatively connected to the pulse module and programmed to:
   define at least one multi-dimensional spatially-selective RF pulse profile to apply to the RF coil array;
   determine a set of desired magnetization values;
   iteratively adjust the at least one multi-dimensional spatially-selective RF pulse profile according to the set of desired magnetization values using an optimal control approach;
   cause the pulse module to generate RF pulses for transmission by RF coil array in accordance with the at least one spatially-selective RF pulse profile, to acquire MR image data; and
   at least temporarily store the MR image data in memory.

2. The MR imaging apparatus of claim 1 wherein the computer is further programmed to initially define the at least one spatially-selective RF pulse profile for the RF coil array using a non-iterative approach.

3. The MR imaging apparatus of claim 2 wherein the non-iterative approach includes at least one of a small tip angle (STA) calculation and a linear class large tip angle (LCLTA) calculation.

4. The MR imaging apparatus of claim 1 wherein the computer is further programmed to iteratively adjust the at least one spatially-selective RF pulse profile by iteratively incrementing or decrementing parameters describing the at least one spatially-selective RF pulse profile.

5. The MR imaging apparatus of claim 1 wherein the RF coil array is arranged for parallel transmission.

6. The MR imaging apparatus of claim 1 wherein the computer is further programmed to iteratively adjust the at least one spatially-selective RF pulse profile according to a first gradient optimization algorithm, the first optimization algorithm comprising one of a first order gradient optimization algorithm, a second order gradient optimization algorithm, and a conjugate gradient optimization algorithm.

7. The MR imaging apparatus of claim 6 wherein the computer is further programmed to accept a user input specifying a set of hard constraints on the first gradient optimization algorithm or a penalty function for the first gradient optimization algorithm.

8. The MR imaging apparatus of claim 1 wherein the computer is further programmed to reconstruct an MR image from the MR image data and show the MR image on a display.

9. A method for MR imaging comprising:
   determining a number of parameters which describe a target multi-channel, multi-dimensional spatially-limited B1 field that will cause a desired change in magnetization in nuclei of a scan subject;
   approximating a multi-channel RF waveform to achieve the target multi-dimensional spatially-limited B1 field;
   expressing an error function describing an error in a magnetization of the approximated multi-channel RF waveform compared to the desired magnetization change;
   minimizing the error function by iteratively adjusting the approximated multi-channel RF waveform; and
   causing a number of RF coils to transmit the adjusted approximated multi-channel RF waveform to acquire an MR image data of the scan subject.

10. The method of claim 9 wherein determining the number of parameters to describe the target multi-dimensional spatially-limited B1 field includes prompting a user to identify at least one of a desired flip angle, a k-space trajectory, a desired gradient waveform, a spatially-limited excitation profile, a desired magnetization profile, an RF pulse type, and an RF pulse duration.

11. The method of claim 9 wherein approximating the multi-channel RF waveform includes calculating the multi-channel RF waveform using at least one of a small tip angle (STA) approximation and a linear class large tip angle (LCLTA) approximation.

12. The method of claim 9 wherein expressing the error function includes finding a mean squared error of the magnetization of the approximated multi-channel RF waveform with respect to the target magnetization.

13. The method of claim 9 wherein iteratively adjusting the approximated multi-channel RE waveform includes smoothing a spatially-limited magnetization profile resulting from the approximated multi-channel RE waveform.

14. The method of claim 9 wherein iteratively adjusting the approximated multi-channel RF waveform includes formulating the error function as an iterative optimal control algorithm.

15. The method of claim 14 further comprising receiving a user input specifying a maximum step size, a maximum number of iterations, and an error tolerance for the iterative optimal control algorithm.

16. The method of claim 9 wherein expressing the equation to describe the target multi-dimensional spatially-limited B1 field includes accounting for an arbitrary desired tip angle and an arbitrary initial magnetization of the nuclei of the scan subject.

17. The method of claim 9 further comprising reconstructing an MR image from the MR data and displaying the MR image to a user.

18. An MR system control comprising:
a computer programmed to:
receive a request for a multi-channel RF pulse of an arbitrary flip angle; and
determine at least one multi-dimensional spatially-selective RF pulse shape in accordance with the request using an optimal control algorithm; wherein the at least one multi-dimensional spatially-selective RF pulse shape is determined according to a set of desired magnetization values;
a pulse module configured to receive the determined multi-dimensional spatially-selective RF pulse shape from the computer and generate a corresponding RF waveform; and
an RF transceiver connected to output the RF waveform of the pulse module for transmission by an RF coil assembly and to receive resulting MR data therefrom.

19. The MR system control of claim 18 wherein the computer is further programmed to determine an approximation of the RF pulse shape prior to using the optimal control algorithm.

20. The MR system control of claim 19 wherein the approximation includes one of a small tip angle approximation (STA) and a linear class large tip angle (LCLTA) approximation.

21. The MR system control of claim 18 wherein the computer is further programmed to determine the RF pulse shape by iteratively adjusting variables describing the RF pulse shape.

22. The MR system control of claim 18 wherein the RF coil assembly includes a number of coils arranged for parallel transmission and the RF pulse shape is one of a 2D spatially-selective and a 3D spatially-selective RF pulse shape.

23. The MR system control of claim 18 wherein the optimal control algorithm includes one of a first order gradient optimization algorithm, a second order gradient optimization algorithm, and a conjugate gradient optimization algorithm.

24. The MR system control of claim 18 further comprising a user interface station configured to communicate to the computer at least one of the arbitrary flip angle, a desired k-space trajectory, and a desired pulse sequence.

25. The MR system control of claim 24 wherein the user interface station is further configured to communicate to the computer a maximum step size, a maximum number of iterations, and an error tolerance for the optimal control algorithm.

26. The MR system control of claim 18 wherein the computer is further programmed to determine the RE pulse shape by minimizing a cost function describing an error of a magnetization profile of the RF pulse shape with respect to a magnetization profile of the requested RF pulse.

27. The MR system control of claim 26 wherein the cost function further includes at least one of a spatial preference weighting term and a penalty term.

* * * * *

UNITED STATES PATENT AND TRADEMARK OFFICE
CERTIFICATE OF CORRECTION

PATENT NO.         : 7,705,594 B2                                                    Page 1 of 1
APPLICATION NO. : 11/694617
DATED              : April 27, 2010
INVENTOR(S)        : Xu et al.

It is certified that error appears in the above-identified patent and that said Letters Patent is hereby corrected as shown below:

Col. 13, line 18 (Claim 13), delete "RE waveform" and
    substitute therefore -- RF waveform --; and Col. 13, line 20 (Claim 13), delete "RE waveform" and
    substitute therefore -- RF waveform --.

Col. 14, line 38 (Claim 26), delete "RE pulse" and
    substitute therefore -- RF pulse --.

Signed and Sealed this

Twenty-ninth Day of June, 2010

David J. Kappos
*Director of the United States Patent and Trademark Office*